United States Patent [19]

Wavish

[11] Patent Number: 5,740,085
[45] Date of Patent: Apr. 14, 1998

[54] DATA PROCESSING APPARATUS FOR THE MODELING OF LOGIC CIRCUITRY

[75] Inventor: Peter R. Wavish, East Grinstead, England

[73] Assignee: U.S. Phillips Corporation, New York, N.Y.

[21] Appl. No.: 498,289

[22] Filed: Jun. 30, 1995

[30] Foreign Application Priority Data

Jun. 30, 1994 [GB] United Kingdom ............... 9413127

[51] Int. Cl.$^6$ ................................................. G06F 9/455
[52] U.S. Cl. ................. 364/578; 364/489; 395/500; 395/920
[58] Field of Search ........................... 364/488, 489, 364/490, 491, 578, DIG. 1, DIG. 2, 580; 395/183.09, 500, 920

[56] References Cited

U.S. PATENT DOCUMENTS

| | | | |
|---|---|---|---|
| 4,541,071 | 9/1985 | Ohmori | 364/DIG. 2 |
| 4,656,580 | 4/1987 | Hitchcock et al. | 364/DIG. 1 |
| 4,694,411 | 9/1987 | Burrows | 364/578 |
| 4,819,150 | 4/1989 | Jennings et al. | 395/500 |
| 4,891,773 | 1/1990 | Ooe et al. | 364/578 |
| 4,918,594 | 4/1990 | Onizuka | 395/500 |
| 5,150,308 | 9/1992 | Hooper et al. | 364/489 |
| 5,363,319 | 11/1994 | Okuda | 364/578 |
| 5,392,227 | 2/1995 | Hiserote | 364/578 |
| 5,410,673 | 4/1995 | Oguro | 395/500 |
| 5,572,708 | 11/1996 | Takahashi | 395/500 |

OTHER PUBLICATIONS

"Stimulating and Implementing Agents and Multiple Agent Systems", by M. Graham et al, Proc. European Simulation Multiconference, 1991, pp. 226–231.

*Primary Examiner*—Kevin J. Teska
*Assistant Examiner*—Tyrone V. Walker
*Attorney, Agent, or Firm*—Debra K. Stephens

[57] ABSTRACT

A data processing apparatus includes a unit (60,68) for modelling a first asynchronous logic circuit as a plurality of circuit elements the functions of which are governed by a set of rules each defining a response to a given condition. For elements functioning as registers, units are provided to apply a constraint (for example an algebraic or Boolean relationship) linking the internal values or output states of two or more of the registers. In response to a change in the internal value or output state of one of the registers, the corresponding one of the internal value or output state of the or one of the other registers is modified to maintain validity of the constraint. Each of the registers has a pointer (VP) to a respective data value or constraint information held in storage (67).

10 Claims, 6 Drawing Sheets

| EN | S | Q | INT | SA |
|---|---|---|---|---|
| 10 | 1 | 0 | N/A | 100 |
| 18 | 0 | 1 | N/A | 150 |
| 86 | 1 | 0 | N/A | 200 |
| 80 | 0 | 0 | 1 | 250 |
| 92 | 0 | 0 | N/A | 300 |
| 96 | 1 | 0 | N/A | 350 |
| 52 | 0 | 0 | 0 | 400 |
| 24 | 0 | 0 | 1 | 450 |
| 88 | 1 | 0 | N/A | 500 |
| 82 | 0 | 0 | 1 | 550 |
| 98 | 0 | 0 | N/A | 600 |
| 26 | 0 | 0 | 1 | 650 |
| 32 | 0 | 0 | N/A | 700 |
| 90 | 1 | 0 | N/A | 750 |
| 84 | 0 | 0 | 1 | 800 |
| 94 | 0 | 0 | N/A | 850 |
| 38 | 1 | 0 | N/A | 900 |
| 44 | 0 | 0 | 0 | 950 |

FIG. 2

DATA PROCESSING APPARATUS FOR THE MODELING OF LOGIC CIRCUITRY

BACKGROUND OF THE INVENTION

The present invention relates to a data processing apparatus for the modeling of logic circuitry and having particular, but not exclusive, application to execution of compiled production rule systems.

The compilation of a production rule system into a representation in the style of a logic circuit is described in Proceedings of the European Simulation Multiconference 1991 at pages 226–231. The production rule system in this example is Real Time ABLE (RTA), where ABLE stands for Agent Behaviour Language which is a highly concurrent production rule language for simulating agents and multiple agent systems. ABLE provides for tighter integration of time with the production rule system. The language may conveniently be compiled into a representation which comprises a number of interconnected elements such as AND elements, OR elements, delay elements and so on. RTA uses a propagation technique as opposed to a search strategy to obtain a fast production rule system.

The execution of a compiled production rule system as in asynchronous logic circuit representation has, however, been found to be rather restrictive in terms of the functions that may be performed and this also limits the versatility of the production system.

SUMMARY OF THE INVENTION

It is therefore an object of the present invention to reduce this restriction.

In accordance with the present invention there is provided a data processing apparatus comprising means for modelling a first asynchronous logic circuit as a plurality of circuit elements the functions of which are governed by a set of rules each defining a response to a given condition and the apparatus comprising means for responding to any said condition being satisfied by generating the associated response, wherein two or more of the elements function as registers each having an internal value and two or more output states, further comprising means arranged to apply a constraint linking the internal values or output states of two or more register function elements and, in response to a change in the internal value or output state of one of the register function elements, to detect the change and modify the corresponding one of the internal value or output state of the other register function element or one of the other register function elements to maintain validity of the constraint.

The apparatus may further comprise means operable to detect when a register function element subject to a constraint is unloaded from a model and to remove the constraint from the further register function element or each further register function element to which it had been applied.

The constraint may comprise an equality of internal value or output state for the register function elements, an algebraic equation, the arguments of which are represented by the internal values or outputs of respective register function elements or a Boolean logic function. Where the constraint is applied to the internal values or output states of three or more register function elements, the system needs to know which of the two or more further element values or outputs is to be modified: this may comprise a storage device accessible by the means for modelling the circuit and containing instructions specific to the constraint configuration as to which of the other element values or outputs is to be modified to maintain the validity of the constraint.

In an embodiment to be described, each register function element may have a pointer to a respective data value held in memory and where the means for modelling is operable to store and execute a number of processor functions, a memory stack may be provided holding pointers to the register function elements and corresponding processor functions.

The apparatus may comprise means for modelling a plurality of further asynchronous logic circuits, and may include a working memory area in which the first and further circuits are modelled, and data storage means from which data defining yet further asynchronous logic circuits may be called into the working memory area. One or more constraints may then be applied to register element pairs formed by register elements from separate ones of the asynchronous logic circuits modelled in the working memory area. A data processing apparatus having these features would accordingly be operable to execute large production rule systems in a relatively modest working memory space. Provided that only a portion of the complete production rule system requires to be executed at any one time, the system may be arranged as a number of modules (circuits) the data for which may be loaded to working memory, executed and then replaced by subsequent circuits.

An apparatus in accordance with the invention may be realised by dedicated hardware or by a suitably programmed microprocessor.

The propagate function may include a list of element identities, being the elements potentially affected by a change of state of the original element. A storage means may conveniently be arranged as an event queue, that is a sequential list of elements whose state is to change at a listed time in the future.

Future changes of element states, or events, are thus queued to occur later and this ensures that all of the events queued to occur in the present time period are carried out before any of the events which are consequential upon them. Future events may be specifically queued to occur later than this as would be required, for example, by a delay element.

In addition to the register elements mentioned above, other conventional logic circuit functions such as AND, OR, delay and so on as determined by the application, may be provided as further elements. One such element function is AND_THEN which provides for the element output to be turned on if and only if the outputs of two or more other elements are turned on in a specified order.

BRIEF DESCRIPTION OF THE DRAWINGS

The present invention will now be described, by way of example, with reference to the accompanying drawings, in which:

FIG. 2 is a table illustrating a representation of the system of FIG. 1;

DESCRIPTION OF THE PREFERRED EMBODIMENTS

Figure 1:
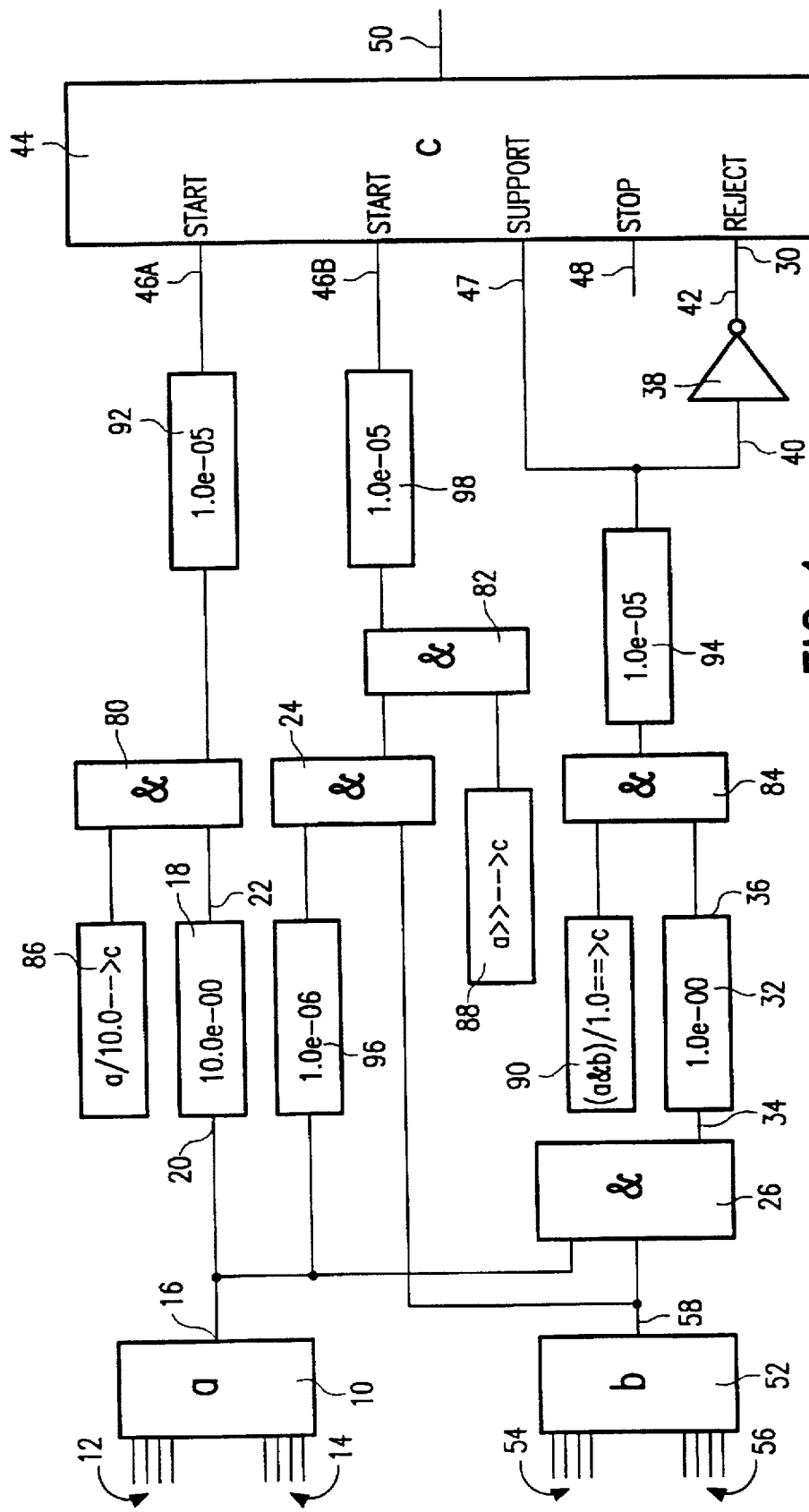
FIG. 1 is a logic representation of a production rule system.

FIG. 1 shows a logic representation of an asynchronous logic circuit compiled from a simple RTA system. Three simple behaviours (registers) a,b,c are combined in three different rules, represented at 86, 88 and 90, with the rule functions being implemented by combinations of logic functions and time annotations (delay elements). FIG. 1 is a simple implementation with each of the rules having a state change for behaviour c defining the response such that the general propagation through the circuit of state changes is from left to right. In a more complex implementation, for example where behaviour c formed part of the condition portion of a rule having behaviour b defining the response, there would be state change propagation additionally from right to left of the Figure (from c to b).

In the implementation of FIG. 1, register 10 (behaviour a) has a plurality of independent start or support inputs 12, a plurality of independent stop or reject inputs 14 (the difference between start and support and between stop and reject is discussed below) and an output 16. The output 16 is respectively connected to the input 20 of a first delay element 18, via a short (1 microsecond) delay element 96 to a first input of an AND element 24, and to a first input of an AND element 26. The delay element 18 sets a delay of 10.0 seconds (although it will be readily appreciated that other units of time may be used) such that the output of the element 18 will be turned on 10 seconds after the input is turned on: the output will however be turned off at the instant the input is turned off. The output 22 of the delay element 18 is combined with rule function 86 at AND element 80 (as is required by RTA) and, through a delay element 92 is connected to a first start input 46A of a register 44 (behaviour c). The register 44 has an output 50. The delay of element 92 (suitably 10 microseconds) is provided to allow the state to settle before being read.

A further register 52 (behaviour b) has a plurality of start or support inputs 54, a plurality of stop or reject inputs 56 and an output 58. The output 58 is connected to second inputs of each of the AND elements 24 and 26. The output of AND element 24 is combined with rule function 88 at AND element 82 and from there via a delay element 98 (again to allow the state to settle before being read) to a further start input 46B of the register 44. The AND element 26 has an output connected to the input 34 of a further delay element 32 having a delay of 1.0 second. The output 36 of the delay element 32 is combined with rule function 90 at AND element 84 and, via a delay element (again to allow the state to settle before being read), is connected to support input 47 of the register 44 and to the input 40 of an inverter 38. The inverter 38 has an output 42 connected to a reject input 30 of the register 44.

The system of FIG. 1 embodies the following RTA program rules:

a/10.0→c  (1)

(a & b)/1.0=→c  (2)

a>>b→c  (3)

(1) and (3) are examples of a type of rule called a licence. (1) has the effect of setting the status of behaviour c (register 44) if the status a of register 10 has been set continuously for 10 seconds. In FIG. 1 this licence is effected by the delay 18 connected between the register 10 and one of the start inputs 46A of the register 44. (3) is an AND_THEN licence requiring the status of behaviour a (register 10) to be presented before the status of behaviour b (register 52).

(2) is a type of rule called a schema which is similar to a licence but which provides the additional effect that as soon as the conditions which satisfied the schema no longer exist then the consequence of the schema is retracted. In this example, the status of behaviour c is set if the outputs of behaviours a and b are both set continuously for 1.0 second. This effect is provided by the output of the AND element 26 being coupled via the delay element 32 to the support input 47 of the register 44. However, the status of the register 44 must also be reset if either the status of register 10 or the status of the register 52 is reset. This effect is achieved by the inverter 38 connected between the output of the AND element 26 and the reject input 48 of the register 44.

The elements of the representation can be regarded as edge-triggered by virtue of the propagating or forward-chaining nature of the apparatus. The inputs to register elements 10,52 and the output of the register element 44 are generally connected to further sections of a larger asynchronous logic representation.

Such a logic representation may be stored in an apparatus in accordance with the present invention in the form of a table as shown in FIG. 2. Each of the behaviours (register elements 10,52,44), time annotations (delay elements 18,32, 92,94,96,98), logic functions (elements 24,26,38,80,82,84), and rules (functions 86,88,90) shown in FIG. 1 has a row in the table. Each row in the table identifies the element number EN (for the sake of clarity the reference numerals of the elements as they appear in FIG. 1 are used), a status flag S of the device, a queued status flag Q of the device (as will be explained), the internal status INT, and a propagate function start address SA. When the status of the device to which the row of the table relates (the originating or host device) changes, a propagate function is executed to effect any appropriate changes to all of the elements which may be affected by such a change. These propagate functions are conveniently arranged at certain memory locations or start addresses SA. Changing the status of elements by propagation in such a manner rather than by searching for all of the elements affected by a change of status allows the apparatus to operate efficiently.

The behaviour of the system as viewed from the inputs of register 44 may be specified as follows:

```
BEHAVIOUR c (YES)
START:
    DELAY 1.0e-05 seconds (NO)
        AND (NO)
            LICENCE (a)/10.0—>c (YES)
                DELAY 10.0 seconds (NO)
                    BEHAVIOUR a (YES)
            DELAY 1.0e-05 seconds (NO)
                AND (NO)
                    LICENCE a> >b—>c (YES)
                        AND THEN (NO)
                            DELAY 1.0e-06 seconds (NO)
                                BEHAVIOUR a (YES)
                            BEHAVIOUR b (YES)
STOP:
    TERMINAL (NO)
SUPPORT:
    DELAY 1.0e-05 seconds (NO)
        AND (NO)
            SCHEMA (a&b)/1.0==>c (YES)
                DELAY 1.0 seconds (NO)
                    AND (YES)
                        BEHAVIOUR a (YES)
```

```
            BEHAVIOUR b (YES)
    REJECT:
        NOT (YES)
            DELAY 1.0e-05 seconds (NO)
            AND (NO)
                SCHEMA (a&b)/1.0==>c (YES)
                DELAY 1.0 seconds (NO)
                AND (YES)
                    BEHAVIOUR a (YES)
                    BEHAVIOUR b (YES)
```

As can be seen, the differentiation between inputs as start or support (and also stop or reject) depends on whether they receive the result of a schema. Inputs 46A and 46B are start inputs as they receive the result of a licence whilst support input 47 receives the result of the schema. The AND element 24 of FIG. 1 is shown functioning as an AND_THEN element as will be described in greater detail hereinafter, with additional delay 96 ensuring the correct order of receipt from register 10 and 52.

Figures 3, 4:
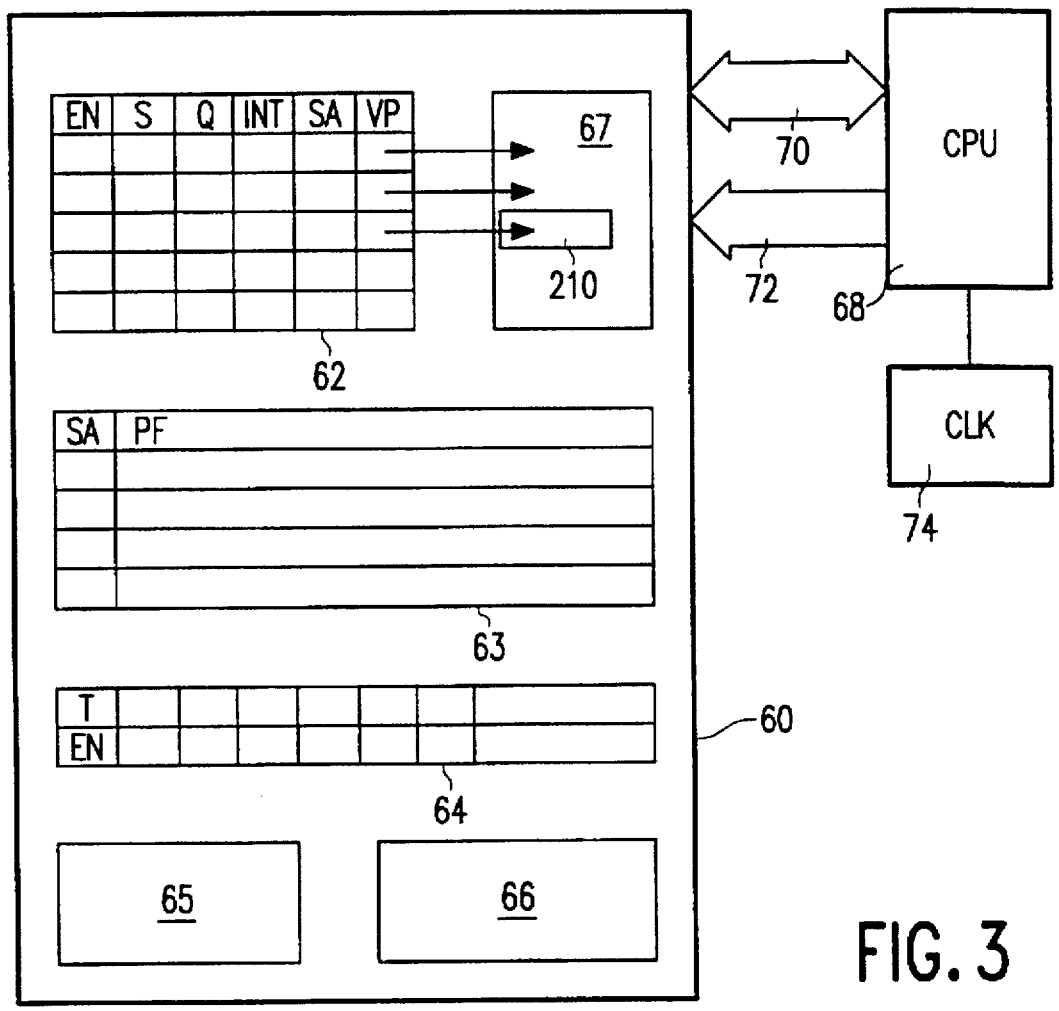
FIG. 3 is a block schematic diagram of a data processing apparatus in accordance with the present invention.
FIG. 4 is a diagram of a queued event storage means of the apparatus of FIG. 3.

FIG. 3 is a block schematic diagram of a data processing apparatus embodying the invention. A random access memory (RAM) 60 comprises a storage means 62 containing the element number EN, state S, queued status Q and propagate function start addresses SA as described with reference to FIG. 2. A further column VP in storage means 62 provides, for each of the elements, a location for element data which may comprise a pointer to constraint information in a further storage area 67 as will be described in greater detail below.

The propagate functions PF starting at the start addresses are stored in another storage means (area of RAM) 63. The RAM 60 also comprises further storage means 64 for storing future element state changes, an event stack 65, and a program store 66. The program store and the propagate functions could, if desired, be stored in another memory device, for example a read only memory. The RAM 60 is connected to a central processing unit (CPU) 68 by a data bus 70 and an address bus 72 in known manner. Also in known manner, a clock (CLK) 74 is connected to the CPU 68.

The further storage means 64 for future element state changes is arranged as shown in FIG. 4 as a two row table containing a plurality of time periods T and element numbers EN. Any number of elements numbers EN can be stored to correspond to a particular time period T and the states of these elements will all be changed during that time period.

Generally, all element state changes except those corresponding to delay elements will be executed in the current time period although other element state changes can be also delayed if desired. Those element state changes which are to occur without a time delay may be placed in the event stack 65 (FIG. 3) for execution in the near future—i.e. later in the current time period, but before moving to the next time period for which an event is specified.

Figure 5:
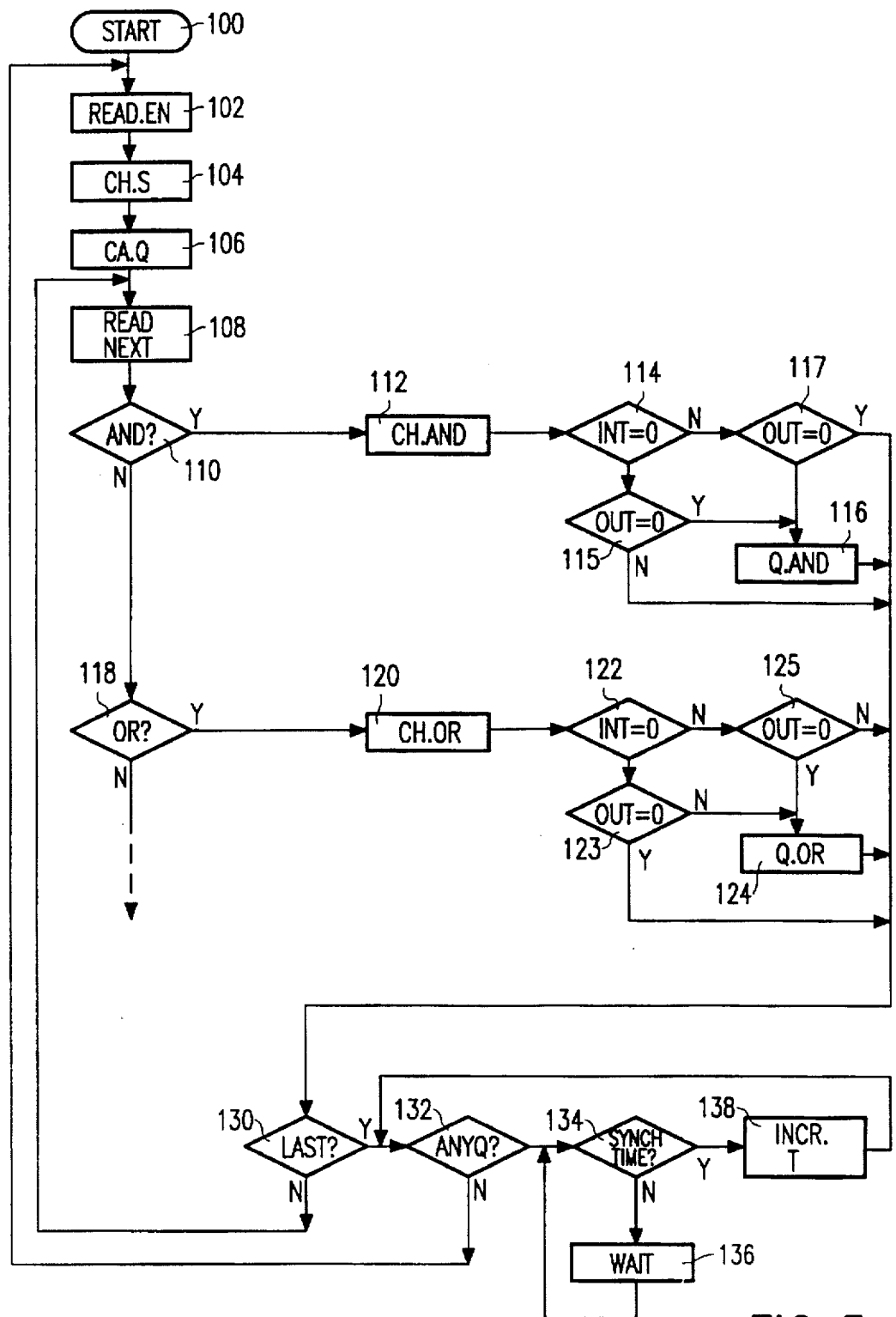
FIG. 5 is a flow chart illustrating the steps carried out by the processor of FIG. 3.

The program store 66 contains the instructions which are performed by the CPU 68 to carry out the changes of device state stored in the memory 62 and to determine the device state changes consequent upon them. FIG. 5 shows a flow chart for the operation of the CPU 68 in accordance with instructions stored in the program store 66. The numbered steps in the flow chart have the following functions.

100—START
102—read element number EN of host element (where provided from memory 64
104—change external state S of host element
106—cancel queued status Q of host element
108—read next item from propagate function of host element
110—Is the item an AND function?
112—alter internal state of specified AND element, decrement if host element state change is from off to on, and increment if from on to off
114—Is internal state of the AND device 0?
115—Is output state of the AND device 0?
116—queue a change of output state of the AND element and set queued flag of AND element
117—Is output state of the AND device 0?
118—Is the item an OR function?
120—alter internal state of specified OR element, increment if host element state change is from off to on, and vice versa
122—Is internal state of OR element 0?
123—Is output state of OR element 0?
124—queue a change of output state of the OR element and set queued flag of OR element
125—Is output state of the OR device 0?
130—Is the present item the last one in the propagation function of the host element?
132—Are there any further elements listed in the event queue at the present time (or in the event stack, if present)
134—has sufficient time elapsed during present time period for system to be synchronised with real time
136—wait a short time
138—Increment short period T The routine of FIG. 5 operates as follows. An item is read from the memory 64 at step 102 and the relevant element output state S and its queued state Q are updated at steps 104,106. The next item in the propagate function for the element is then read from the relevant PF portion of the memory 63. If the item is an AND function the internal state of the specified AND element is altered. The internal state of an AND element is equal to the number of inputs to that element which are off or logical zero. Accordingly when the internal state of the element is zero, the AND function is satisfied and the output state should be on or logical one. If the change of state of the host element that was effected at step 104 was to turn the host element on (or a change from logical 0 to logical 1) then the internal state of an AND element in its propagation function is reduced by 1. Conversely if the change of state that was effected at step 104 was to turn the host element off (or a change from logical 1 to logical 0) then the internal state of an AND element specified in its propagation function is increased by 1. The crucial internal state changes for an AND element are from 0 to 1 and from 1 to 0. If either of these changes occurs then the output state of the element should change accordingly. The change in output state is not effected immediately to avoid clashes within the apparatus but is queued for future execution in the same time interval. The queued status Q of the element is turned on or set to logical 1 in the memory 62.

If the item read from the PF in memory 62 is an OR element the internal state of the specified OR element is altered accordingly. If the change of state of the host element at step 104 was to turn the host element on then the internal state of the OR element is increased by 1. Again the important internal state changes are from 0 to 1 and 1 to 0 but the consequences for the output state of the device are reversed: the change in internal state from 0 to 1 makes the output state 1, and the change from 1 to 0 makes the output state 0. Again the actual change of state is placed in the queue in memory 64 for execution in the next time period. The remaining steps of the flow chart of FIG. 5 provide for checking of the event queue and allowing for synchronisation as will be readily understandable from the above.

Element propagate functions may further comprise the following instructions which may be placed in the PF memory and effectively added to the flow chart of FIG. 5 below step 118 (i.e. following determination that the function is neither AND nor OR). These are listed below in terms of their effect if the host element has turned on or off.

If the host element to which the propagate function is attached turns ON:

start_behaviour turns the specified element output on after 1 time unit support_behaviour turns the specified element output on after 1 time unit depending on internal state stop_behaviour turns the specified element output off after 1 time unit reject_behaviour turns the specified element output off after 1 time unit depending on internal state delay turns the specified delay element output on after a specified number of time units AND decreased internal state of specified AND element and turn output state on if internal state=0

AND_THEN_left enables the AND THEN element by setting an internal state bit in that element AND_THEN_right turns the AND THEN element on if it is enabled NOT turns the output of the NOT element (invertor) off.

finish stops executing the current propagate function and starts executing the propagate function belonging to the next element listed in the present time period or event queue (when present)

constraint creates a new constraint instance no_constraint no effect execute executes a constraint CPU routine TLU add the weight specified in the TLU instruction to the internal state of the specified TLU element. If internal state rises above/falls below threshold then turn output state on/off.

If the host element to which the propagate function is attached turns OFF:

start_behaviour no effect support_behaviour no effect stop_behaviour no effect reject_behaviour no effect delay turns the specified delay element output off immediately AND_THEN_left disables the specified AND_THEN element by clearing the internal state bit AND_THEN_right turns the AND_THEN element off NOT turns the output of the NOT element on finish stops executing the current propagate function and starts executing the propagate function belonging to the next element listed in the present time period or event queue (where present)

constraint remove constraint data block with associated no_constraint and execute instructions no_constraint remove constraint data block with associated no_constraint and execute instructions execute executes constraint CPU function TLU subtract the weight specified in the TLU instruction from the internal state of the specified TLU element. If internal state rises above/falls below threshold then turn output state on/off The constraint, no_constraint, execute, TLU and the AND_THEN instructions will now be further explained.

Figure 6:
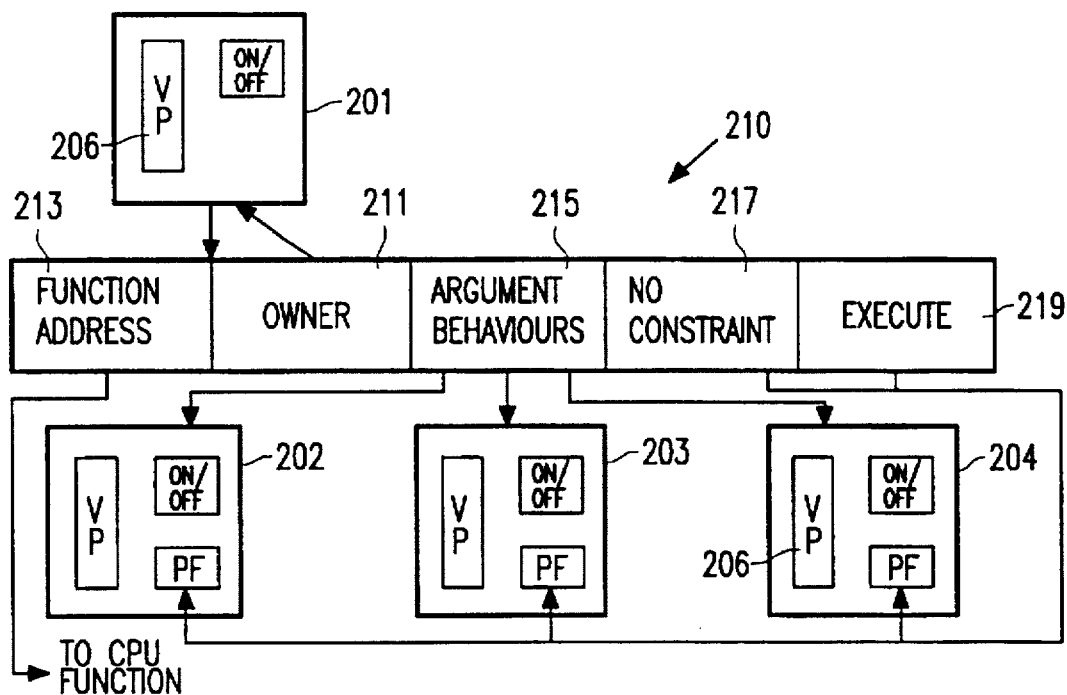
FIG. 6 schematically illustrates operation of a section of the constraint data area of the memory of FIG. 3.

Referring to FIG. 6, to provide for constraints, each of the behaviours 201–204 (register function elements) has a pointer 206 to a value VP which can be any data type supported by the CPU. In the following, it is assumed that the CPU (68, FIG. 3) supports C and accordingly references to C coding and C functions should be construed accordingly.

The system is provided with a FILO stack of pointers to behaviours which is used to hold the arguments of C functions with various instructions as given above being provided to manipulate the stack. The C functions can operate on the values of argument behaviours by, amongst others, separating them from behaviours in which they appear.

Returning to FIG. 6, when the constraint instruction is executed as a result of the behaviour 201 representing the constraint turning on, it causes a block 210 of the constraint data memory (67, FIG. 3) to be allocated to hold the constraint data. This block is filled with at least a pointer 211 to the behaviour 201 which owns it; the address 213 of the C function; a set 215 of argument behaviours 202–204 for the C function; a set 217 of no_constraint instructions; and a set 219 of execute instructions. The no_constraint instructions 219 are linked into the propagate functions PF of behaviours 202–204 representing the modules containing the argument behaviours so that a no_constraint instruction is executed to remove the constraint whenever a module is unloaded and hence the argument behaviour it contains disappears. The execute instructions 219 are also linked into the propagate functions PF of argument behaviours 202–204 so that when an argument behaviour changes state (on to off, or off to on) the constraint C function addressed at 213 is called. This C function is also called when an argument behaviour blinks, that is to say when the behaviour state instantaneously changes on-off-on again or off-on-off again.

When the constraint instruction turns off, the no_constraint and execute instructions are unthreaded from the behaviour propagate functions and the whole constraint data block 210 is deleted from memory area 67. Executing a no_constraint instruction turns off the constraint behaviour 201 thereby freeing the constraint data block 210 as above. It will be appreciated that the constraint is only enforced when the constraint behaviour 201 is on. The arguments 202–204 of the behaviour are evaluated once when the constraint turns on and their values are frozen into the constraint data block 210. Executing an execute instruction causes the C function to be called with the arguments specified in the constraint data block.

There are no fixed rules for the coding of the constraint C function but it must be written to be sensitive to the particular reason why it was executed, for example whether it was the result of the constraint being created or as a result of the particular argument changing state. Some degree of commonality may be introduced by specifying rules for dealing with regularly encountered constraint features. For example, where the constraint links several behaviours, the argument value to be altered to maintain the validity of the constraint may be chosen always to be the highest argument value if it was not a change in that which initiated the alteration. It may be convenient to give a programmer access to the constraint behaviour 201 itself as well as its arguments. This may be done by passing it as an extra argument to the C function.

Whilst preferred, no specific provision need be made for controlling the propagation of changes through constraints. Propagation control can be achieved, however, by masks which filter out incoming and outgoing changes on particular arguments. In the most degenerate case, when all the arguments are masked off, the constraint C function is executed only when the constraint is first applied, regardless of how its arguments change subsequently. This in effect provides an external function call mechanism.

Figure 7:
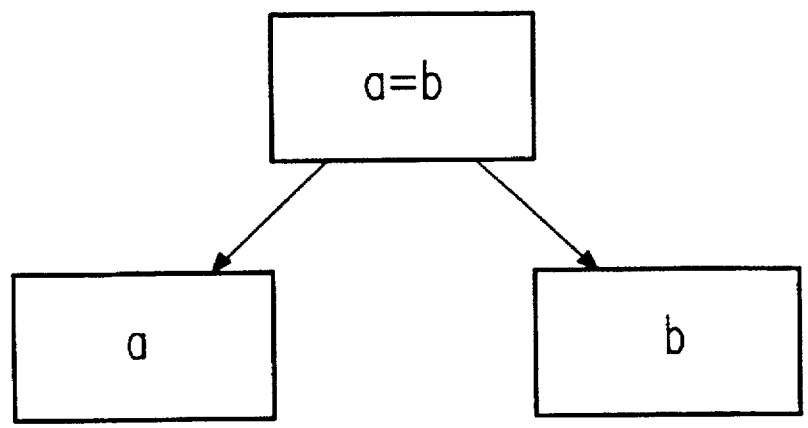
FIGS. 7 to 9 schematically represent equivalence, algebraic and Boolean constraint types respectively.
Figure 8:
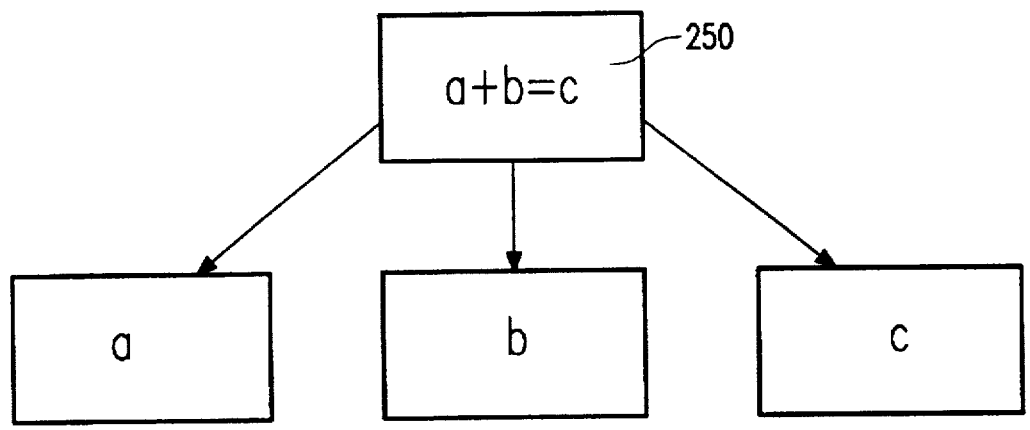
Figure 9:
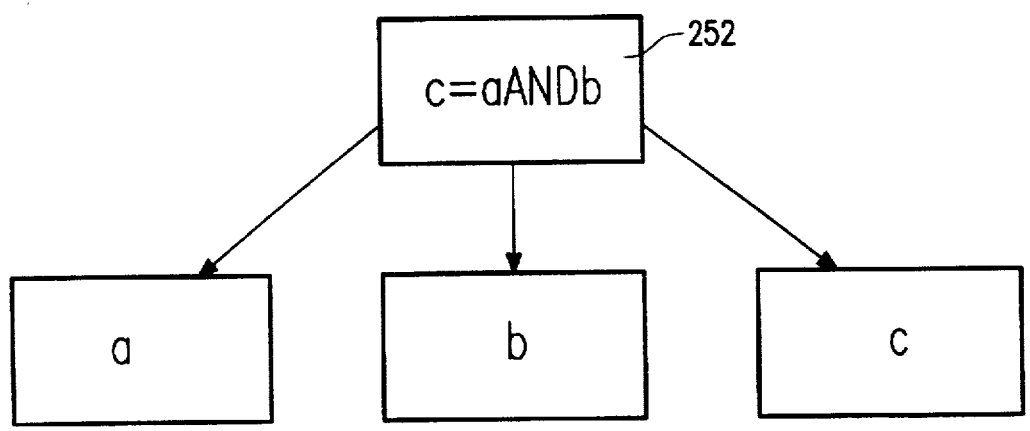

An example of a constraint is an equivalence or identify constraint as represented by FIG. 7. The identify constraint C function copies the state of its incoming argument behaviour (a) to the other argument behaviour (b), so ensuring that changes can propagate in either direction through the constraint and that the state of the two behaviours is maintained to be the same. An equation constraint is represented by FIG. 8, where the constraint 250 maintains the data value or output of register function element c to be equal to the sum of the data values or outputs of register function elements a and b. FIG. 9 represents a Boolean constraint in which the constraint 252 maintains the output of register function element c to be the result of a logical AND operation on the outputs of register function elements a and b.

Figure 10:
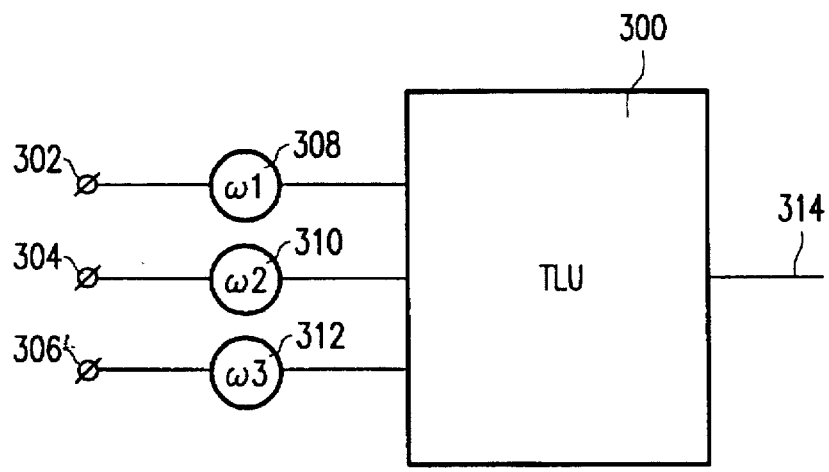
FIG. 10 shows a threshold logic unit (TLU).

Apparatus embodying the invention may be arranged to operate with further element types for example a threshold logic unit (TLU). A TLU 300 is shown in FIG. 10 and comprises a number of binary inputs 302, 304, 306 connected to respective weighting devices 308, 310, 312. The weighting devices 308, 310, 312 multiply the binary inputs by factors w1, w2 and w3 respectively and the TLU adds the weighted inputs together. If the sum of the weighted inputs is equal to or exceeds a threshold value then an output 314 of the TLU will be turned on and if the sum of the weighted inputs is less than the threshold then the output of the TLU will be turned off.

A TLU instruction in the propagate function of an originating element may have the form:

TLU,300,w where w is the weight which is applied to the binary output of the originating element for application to the TLU 300. The TLU instruction may conveniently be arranged to only add (if the originating element turns on) or subtract (if the originating element turns off) the specified weight to an internal TLU state. If the internal state increases above or falls below the threshold then the output state of the TLU 300 changes and its own propagate function is executed.

The AND_THEN function provides an output state if a first specified input becomes set and then a second specified input becomes set. An internal state bit is used to define the intermediate state in response to the first specified input becoming set which is effected by the previously described AND_THEN_left instruction. If the second specified input becomes set by the previously described AND_THEN_right instruction, and this internal state bit is already set, then the output of the AND_THEN element turns on. If either input turns off, the AND_THEN element output state turns off.

The propagate function for a device may be stored remote from the memory 60, and the SA portion of memory 62 then contains the address of the relevant portion of memory. This is especially useful if the propagate functions are large or duplicated. The probability of two devices having identical propagate functions increases with the size of the system. To exploit such duplication, the propagate function may be arranged to specify target elements by use of relative addressing.

An apparatus embodying the present invention may be arranged to support a number of different systems each having their own event queue and being interconnected by use of identifying (equivalence) constraints. In such a case the constraints concerned would need to be extended to specify the system in which the target device is located. Such different systems could be implemented on different machines to provide multiprocessing. The constraint function would then also need to specify the machine in which the target device is located.

From reading the present disclosure, other modifications will be apparent to persons skilled in the art. Such modifications may involve other features which already known in the field of data processing apparatuses and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A data processing apparatus comprising:

means for modelling a first asynchronous logic circuit as a plurality of circuit elements, the functions of said plurality of circuit elements being governed by a set of rules, each rule defining a response to a given condition;

means for responding to any condition being satisfied by generating an associated response, wherein two or more of the circuit elements function as registers, each register having an internal value and two or more output states; and means arranged to apply a constraint linking internal values or output states of two or more register function elements and, in response to a change in an internal value or an output state of one of the register function elements, to detect the change and modify a corresponding internal value or output state of the other register function element or one of the other register function elements to maintain validity of the constraint.

2. Apparatus as claimed in claim 1, further comprising means operable to detect when a register function element subject to a constraint is unloaded from a model and to remove the constraint from a further register function element or each further register function element to which the constraint had been applied.

3. Apparatus as claimed in claim 1, wherein the constraint comprises an equality of internal value or output state for the register function elements.

4. Apparatus as claimed in claim 1, wherein the constraint comprises an algebraic equation, arguments of the algebraic equation being represented by the internal values or outputs of respective register function elements.

5. Apparatus as claimed in claim 1, wherein the constraint comprises a Boolean logic function.

6. Apparatus as claimed in claim 1, wherein the constraint is applied to the internal values or output states of three or more register function elements;

and said means for applying the constraint further comprises a storage device containing instructions specific to the constraint configuration concerning which of the other element internal values or outputs is to be modified to maintain validity of the constraint.

7. Apparatus as claimed in claim 6, further comprising data storage means and wherein each register function element has a pointer to a respective data value held in said storage device.

8. Apparatus as claimed in claim 7, wherein said means for modelling is operable to store and execute a number of processor functions, and comprises a memory stack holding pointers to the register function elements and corresponding processor functions.

9. Apparatus as claimed in claim 1, further comprising:
means for modelling a plurality of further asynchronous logic circuits, including a working memory area in which the first asynchronous logic circuit and further asynchronous logic circuits are modelled; and
data storage means from which data defining yet further asynchronous logic circuits may be called into a working memory area.

10. Apparatus as claimed in claim 9, wherein one or more constraints are applied to register element pairs formed by register elements from separate ones of the asynchronous logic circuits modelled in the working memory area.

* * * * *